United States Patent
Haba

(10) Patent No.: US 11,764,177 B2
(45) Date of Patent: Sep. 19, 2023

(54) BONDED STRUCTURE WITH INTERCONNECT STRUCTURE

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/171,531

(22) Filed: Feb. 9, 2021

(65) Prior Publication Data
US 2022/0077087 A1     Mar. 10, 2022

Related U.S. Application Data

(60) Provisional application No. 63/074,928, filed on Sep. 4, 2020.

(51) Int. Cl.
*H01L 23/48*  (2006.01)
*H01L 23/52*  (2006.01)
(Continued)

(52) U.S. Cl.
CPC .......... *H01L 24/08* (2013.01); *H01L 23/3121* (2013.01); *H01L 23/5383* (2013.01);
(Continued)

(58) Field of Classification Search
CPC combination set(s) only.
See application file for complete search history.

(56) References Cited

U.S. PATENT DOCUMENTS

| 4,998,665 A | 3/1991 | Hayashi |
| 5,019,673 A | 5/1991 | Juskey et al. |

(Continued)

FOREIGN PATENT DOCUMENTS

| CN | 103681646 | 3/2014 |
| EP | 1011133 A1 | 6/2000 |

(Continued)

OTHER PUBLICATIONS

Braunisch, H. et al., "High-speed performance of silicon bridge die-to-die interconnects," 2011 IEEE, pp. 95-98.

(Continued)

*Primary Examiner* — Niki H Nguyen
(74) *Attorney, Agent, or Firm* — Knobbe, Martens, Olson & Bear LLP

(57) ABSTRACT

A bonded structure is disclosed. The bonded structure can include an interconnect structure. The bonded structure can also include a first die directly bonded to the interconnect structure. The bonded structure can also include a second die mounted to the interconnect structure. The second die is spaced apart from the first die laterally along an upper surface of the interconnect structure. The second die is electrically connected with the first die at least partially through the interconnect structure. The bonded structure can further include a dielectric layer that is disposed over the upper surface of the interconnect structure between the first die and the second die.

19 Claims, 7 Drawing Sheets

(51) Int. Cl.
  *H01L 29/40*  (2006.01)
  *H01L 23/00*  (2006.01)
  *H01L 23/538* (2006.01)
  *H01L 25/065* (2023.01)
  *H01L 23/31*  (2006.01)

(52) U.S. Cl.
  CPC .............. *H01L 24/05* (2013.01); *H01L 24/80* (2013.01); *H01L 24/96* (2013.01); *H01L 24/97* (2013.01); *H01L 25/0655* (2013.01); *H01L 2224/05647* (2013.01); *H01L 2224/08235* (2013.01)

(56) References Cited

U.S. PATENT DOCUMENTS

| | | | |
|---|---|---|---|
| 5,051,802 | A | 9/1991 | Prost et al. |
| 5,087,585 | A | 2/1992 | Hayashi |
| 5,322,593 | A | 6/1994 | Hasegawa et al. |
| 5,753,536 | A | 5/1998 | Sugiyama et al. |
| 5,771,555 | A | 6/1998 | Eda et al. |
| 5,854,507 | A | 12/1998 | Miremadi et al. |
| 5,956,605 | A | 9/1999 | Akram et al. |
| 5,985,739 | A | 11/1999 | Plettner et al. |
| 5,998,808 | A | 12/1999 | Matsushita |
| 6,008,126 | A | 12/1999 | Leedy |
| 6,080,640 | A | 6/2000 | Gardner et al. |
| 6,121,688 | A | 9/2000 | Akagawa |
| 6,265,775 | B1 | 7/2001 | Seyyedy |
| 6,374,770 | B1 | 4/2002 | Lee |
| 6,423,640 | B1 | 7/2002 | Lee et al. |
| 6,465,892 | B1 | 10/2002 | Suga |
| 6,582,991 | B1 | 6/2003 | Maeda et al. |
| 6,768,208 | B2 | 7/2004 | Lin et al. |
| 6,782,610 | B1 | 8/2004 | Iijima et al. |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,078,811 | B2 | 7/2006 | Suga |
| 7,105,980 | B2 | 9/2006 | Abbott et al. |
| 7,126,212 | B2 | 10/2006 | Enquist et al. |
| 7,193,423 | B1 | 3/2007 | Dalton et al. |
| 7,319,197 | B2 | 1/2008 | Oggioni et al. |
| 7,354,798 | B2 | 4/2008 | Pogge et al. |
| 7,554,203 | B2 | 6/2009 | Zhou et al. |
| 7,582,971 | B2 | 9/2009 | Kameyama et al. |
| 7,589,409 | B2 | 9/2009 | Gibson et al. |
| 7,663,231 | B2 | 2/2010 | Chang et al. |
| 7,750,488 | B2 | 7/2010 | Patti et al. |
| 7,759,751 | B2 | 7/2010 | Ono |
| 7,786,572 | B2 | 8/2010 | Chen |
| 7,803,693 | B2 | 9/2010 | Trezza |
| 7,977,789 | B2 | 7/2011 | Park |
| 8,049,303 | B2 | 11/2011 | Osaka et al. |
| 8,064,224 | B2 | 11/2011 | Mahajan et al. |
| 8,168,458 | B2 | 5/2012 | Do et al. |
| 8,178,963 | B2 | 5/2012 | Yang |
| 8,178,964 | B2 | 5/2012 | Yang |
| 8,183,127 | B2 | 5/2012 | Patti et al. |
| 8,193,632 | B2 | 6/2012 | Chang et al. |
| 8,227,904 | B2 | 7/2012 | Braunisch et al. |
| 8,241,961 | B2 | 8/2012 | Kim et al. |
| 8,263,434 | B2 | 9/2012 | Pagaila et al. |
| 8,314,007 | B2 | 11/2012 | Vaufredaz |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,146 | B2 | 7/2013 | Chen et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,519,514 | B2 | 8/2013 | Fujii |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,691,601 | B2 | 4/2014 | Izuha |
| 8,697,493 | B2 | 4/2014 | Sadaka |
| 8,716,105 | B2 | 5/2014 | Sadaka et al. |
| 8,791,575 | B2 | 7/2014 | Oganesian et al. |
| 8,802,538 | B1 | 8/2014 | Liu |
| 8,809,123 | B2 | 8/2014 | Liu et al. |
| 8,841,002 | B2 | 9/2014 | Tong |
| 8,878,353 | B2 | 11/2014 | Haba et al. |
| 8,901,748 | B2 | 12/2014 | Manusharow et al. |
| 8,912,670 | B2 | 12/2014 | Teh et al. |
| 8,975,726 | B2 | 3/2015 | Chen et al. |
| 8,987,137 | B2 | 3/2015 | Bachman et al. |
| 8,988,299 | B2 | 3/2015 | Kam et al. |
| 9,093,350 | B2 | 7/2015 | Endo et al. |
| 9,126,236 | B2 | 9/2015 | Roos et al. |
| 9,136,293 | B2 | 9/2015 | Yee et al. |
| 9,142,517 | B2 | 9/2015 | Liu et al. |
| 9,153,552 | B2 | 10/2015 | Teh et al. |
| 9,159,690 | B2 | 10/2015 | Chiu |
| 9,171,756 | B2 | 10/2015 | Enquist et al. |
| 9,171,816 | B2 | 10/2015 | Teh et al. |
| 9,184,125 | B2 | 11/2015 | Enquist et al. |
| 9,190,380 | B2 | 11/2015 | Teh et al. |
| 9,224,704 | B2 | 12/2015 | Landru |
| 9,230,941 | B2 | 1/2016 | Chen et al. |
| 9,252,172 | B2 | 2/2016 | Chow et al. |
| 9,257,399 | B2 | 2/2016 | Kuang et al. |
| 9,269,701 | B2 | 2/2016 | Starkston et al. |
| 9,275,971 | B2 | 3/2016 | Chiu et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,349,703 | B2 | 5/2016 | Chiu et al. |
| 9,355,997 | B2 | 5/2016 | Katkar et al. |
| 9,368,866 | B2 | 6/2016 | Yu |
| 9,385,024 | B2 | 7/2016 | Tong et al. |
| 9,394,161 | B2 | 7/2016 | Cheng et al. |
| 9,437,572 | B2 | 9/2016 | Chen et al. |
| 9,443,796 | B2 | 9/2016 | Chou et al. |
| 9,443,824 | B1 | 9/2016 | We et al. |
| 9,461,007 | B2 | 10/2016 | Chun et al. |
| 9,466,586 | B1 | 10/2016 | Choi et al. |
| 9,476,898 | B2 | 10/2016 | Takano |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,601,353 | B2 | 3/2017 | Huang et al. |
| 9,620,481 | B2 | 4/2017 | Edelstein et al. |
| 9,627,365 | B1 | 4/2017 | Yu et al. |
| 9,656,852 | B2 | 5/2017 | Cheng et al. |
| 9,666,502 | B2 | 5/2017 | Chen et al. |
| 9,666,559 | B2 | 5/2017 | Wang et al. |
| 9,704,827 | B2 | 7/2017 | Huang et al. |
| 9,722,098 | B1 | 8/2017 | Chung et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,881,882 | B2 | 1/2018 | Hsu et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 9,966,360 | B2 | 5/2018 | Yu et al. |
| 10,008,844 | B2 | 6/2018 | Wang et al. |
| 10,026,605 | B2 | 7/2018 | Doub et al. |
| 10,032,722 | B2 | 7/2018 | Yu et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,269,853 | B2 | 4/2019 | Katkar et al. |
| 10,276,619 | B2 | 4/2019 | Kao et al. |
| 10,276,909 | B2 | 4/2019 | Huang et al. |
| 10,418,277 | B2 | 9/2019 | Cheng et al. |

(56) References Cited

U.S. PATENT DOCUMENTS

| | | |
|---|---|---|
| 10,446,456 B2 | 10/2019 | Shen et al. |
| 10,559,507 B1 | 2/2020 | Saketi et al. |
| 10,707,087 B2 | 7/2020 | Uzoh et al. |
| 10,727,204 B2 | 7/2020 | Agarwal et al. |
| 10,727,219 B2 | 7/2020 | Uzoh et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,626 B2 | 10/2021 | Hwang et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,387,214 B2 | 7/2022 | Wang et al. |
| 11,462,419 B2 | 10/2022 | Haba |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2004/0084414 A1 | 5/2004 | Sakai et al. |
| 2004/0238927 A1 | 12/2004 | Miyazawa |
| 2005/0040530 A1 | 2/2005 | Shi |
| 2005/0133930 A1 | 6/2005 | Savastisuk et al. |
| 2005/0153522 A1 | 7/2005 | Hwang et al. |
| 2005/0218518 A1 | 10/2005 | Jiang et al. |
| 2006/0057945 A1 | 3/2006 | Hsu et al. |
| 2006/0087042 A1 | 4/2006 | Kameyama et al. |
| 2006/0278331 A1 | 12/2006 | Dugas et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0079105 A1 | 4/2008 | Chang et al. |
| 2008/0231311 A1 | 9/2008 | Condorelli et al. |
| 2008/0265421 A1 | 10/2008 | Brunnbauer et al. |
| 2008/0308928 A1 | 12/2008 | Chang |
| 2009/0068831 A1 | 3/2009 | Enquist et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0123268 A1 | 5/2010 | Menard |
| 2010/0167534 A1 | 7/2010 | Iwata |
| 2010/0259166 A1 | 10/2010 | Cok et al. |
| 2010/0327424 A1 | 12/2010 | Braunisch et al. |
| 2011/0074033 A1 | 3/2011 | Kaltalioglu et al. |
| 2011/0290552 A1 | 12/2011 | Palmateer et al. |
| 2012/0074585 A1 | 3/2012 | Koo et al. |
| 2012/0187516 A1 | 7/2012 | Sato |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2013/0037962 A1 | 2/2013 | Xue |
| 2013/0122655 A1 | 5/2013 | Yu et al. |
| 2013/0265733 A1 | 10/2013 | Herbsommer et al. |
| 2013/0299997 A1 | 11/2013 | Sadaka |
| 2014/0013606 A1 | 1/2014 | Nah et al. |
| 2014/0154839 A1 | 6/2014 | Ahn et al. |
| 2014/0175655 A1 | 6/2014 | Chen et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0370658 A1 | 12/2014 | Tong et al. |
| 2015/0021754 A1 | 1/2015 | Lin et al. |
| 2015/0064498 A1 | 3/2015 | Tong |
| 2015/0102468 A1 | 4/2015 | Kang et al. |
| 2015/0171050 A1 | 6/2015 | Chen et al. |
| 2015/0179481 A1 | 6/2015 | Lin |
| 2015/0194406 A1 | 7/2015 | Teh et al. |
| 2015/0262845 A1 | 9/2015 | Hwang et al. |
| 2015/0340285 A1 | 11/2015 | Enquest et al. |
| 2016/0126634 A1 | 5/2016 | Liu et al. |
| 2016/0163650 A1 | 6/2016 | Gao et al. |
| 2016/0260684 A1 | 9/2016 | Zhai et al. |
| 2016/0300813 A1 | 10/2016 | Zhai et al. |
| 2016/0300817 A1 | 10/2016 | Do et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2017/0062366 A1 | 3/2017 | Enquist |
| 2017/0062383 A1 | 3/2017 | Yee et al. |
| 2017/0179078 A1 | 4/2017 | Yu et al. |
| 2017/0125379 A1 | 5/2017 | Chen et al. |
| 2017/0148764 A1 | 5/2017 | Wang et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0338214 A1* | 11/2017 | Uzoh ............... H01L 23/3121 |
| 2017/0365580 A1 | 12/2017 | Shih et al. |
| 2018/0005984 A1 | 1/2018 | Yu et al. |
| 2018/0005992 A1 | 1/2018 | Yu et al. |
| 2018/0012787 A1 | 1/2018 | Oka et al. |
| 2018/0026008 A1 | 1/2018 | Jeng et al. |
| 2018/0053746 A1 | 2/2018 | Yu et al. |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0138101 A1 | 5/2018 | Yu et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0221548 A1 | 7/2019 | Huang et al. |
| 2019/0265411 A1 | 8/2019 | Huang et al. |
| 2019/0333550 A1 | 10/2019 | Fisch |
| 2019/0333871 A1 | 10/2019 | Chen et al. |
| 2019/0348336 A1 | 11/2019 | Katkar et al. |

(56) References Cited

U.S. PATENT DOCUMENTS

| | | |
|---|---|---|
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006309 A1* | 1/2020 | Chen .................. H01L 21/481 |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098412 A1 | 4/2021 | Haba et al. |
| 2021/0098421 A1 | 4/2021 | Wu et al. |
| 2021/0111125 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1 | 7/2021 | Wu et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0384133 A1 | 12/2021 | Ong et al. |
| 2021/0384135 A1 | 12/2021 | Kuan et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0407941 A1 | 12/2021 | Haba |
| 2022/0005787 A1 | 1/2022 | Han et al. |
| 2022/0077063 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0375864 A1 | 11/2022 | Wang et al. |
| 2023/0005850 A1 | 1/2023 | Fountain, Jr. |

FOREIGN PATENT DOCUMENTS

| | | |
|---|---|---|
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2008-130603 A | 6/2008 |
| JP | 2011-171614 | 9/2011 |
| JP | 2013-33786 | 2/2013 |
| JP | 2018-160519 | 10/2018 |
| KR | 10-2001-0104643 | 11/2001 |
| KR | 10-2010-0123755 | 11/2010 |
| KR | 10-2015-0097798 | 8/2015 |
| KR | 10-2020-0092236 | 8/2020 |
| WO | WO 2005/043584 A2 | 5/2005 |
| WO | WO 2006/100444 A1 | 9/2006 |
| WO | WO 2008/112101 A2 | 9/2008 |
| WO | WO 2010/024678 A1 | 3/2010 |
| WO | WO 2017/034654 A1 | 3/2017 |
| WO | WO 2017/052652 A1 | 3/2017 |
| WO | WO 2017/151442 A1 | 9/2017 |

OTHER PUBLICATIONS

NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.

"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.

Urteaga, M. et al., "THz bandwidth InP HBT technologies and heterogeneous integration with Si CMOS," 2016 IEEE Bipolar/BICMOS Circuits and Technology Meeting (BCTM), 2016, pp. 35-41, doi: 10.1109/BCTM.2016.7738973.

International Search Report and Written Opinion dated Dec. 8, 2021, issued in International Application No. PCT/US2021/046753, 9 pages.

Amirfeiz et al., "Formation of silicon structures by plasma-activated wafer bonding," Journal of The Electrochemical Society, 2000, vol. 147, No. 7, pp. 2693-2698.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

(56) References Cited

OTHER PUBLICATIONS

Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
Fukushima, T. et al., "New three-dimensional integration technology using self-assembly technique," International Electron Devices Meeting 5-7.12.2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated Apr. 22, 2019 in International Application No. PCT/US2018/064982, 13 pages.
International Search Report and Written Opinion dated Oct. 25, 2019, issued in International Application No. PCT/US2019/040622, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of Mems Ic probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS les," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.

Matsuzawa et al., "Room-temperature interconnection of electroplated Au microbump by means of surface activated bonding method," Electornic Components and Technology Conference, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1 -3, pp. 407-412, see pp. 407-412, and Figures 1 (a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," TRANDUCERS, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.

(56) References Cited

OTHER PUBLICATIONS

Takagi et al., "Low temperature direct bonding of silicon and silicon dioxide by the surface activation method," Solid State Sensors and Actuators, 1997, TRANSDUCERS '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D Mems and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.

\* cited by examiner

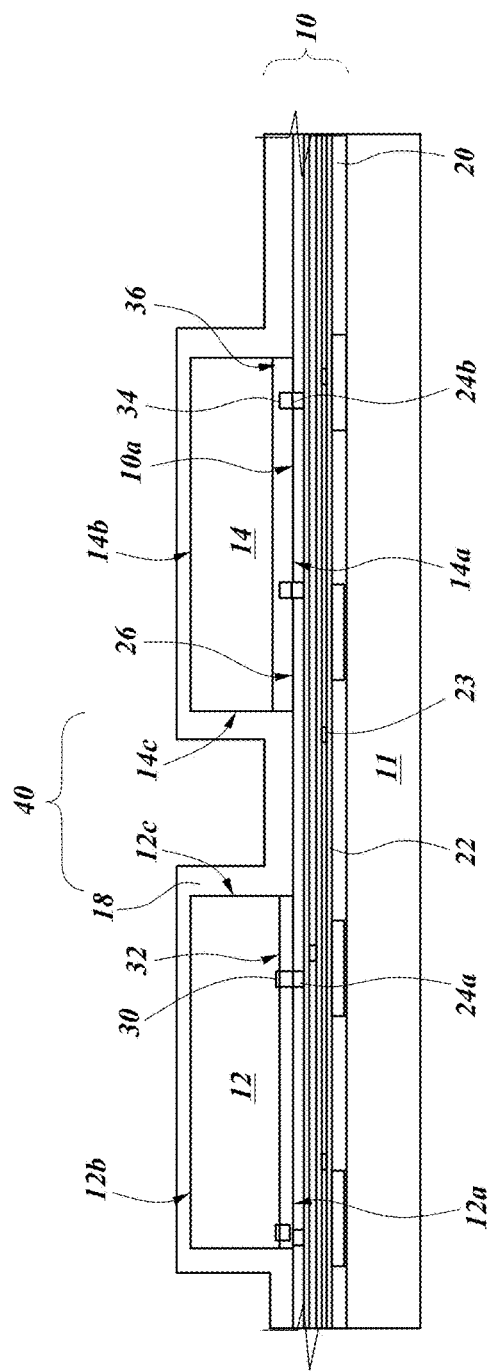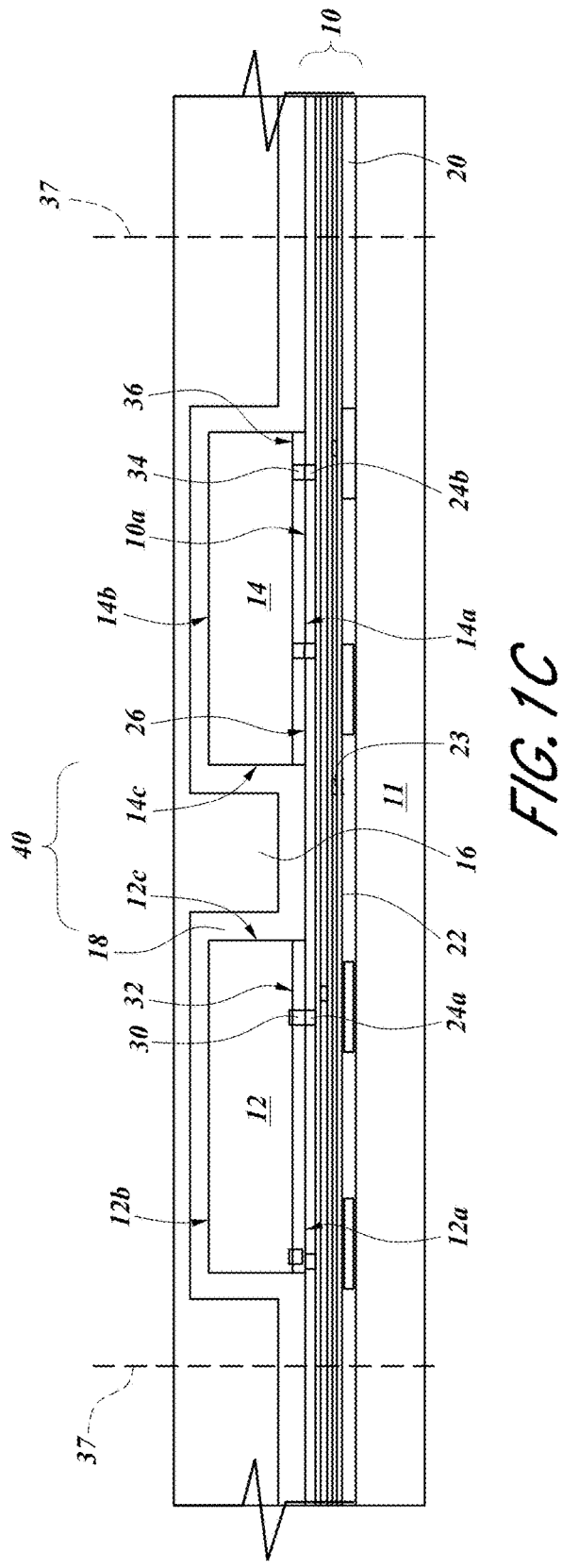

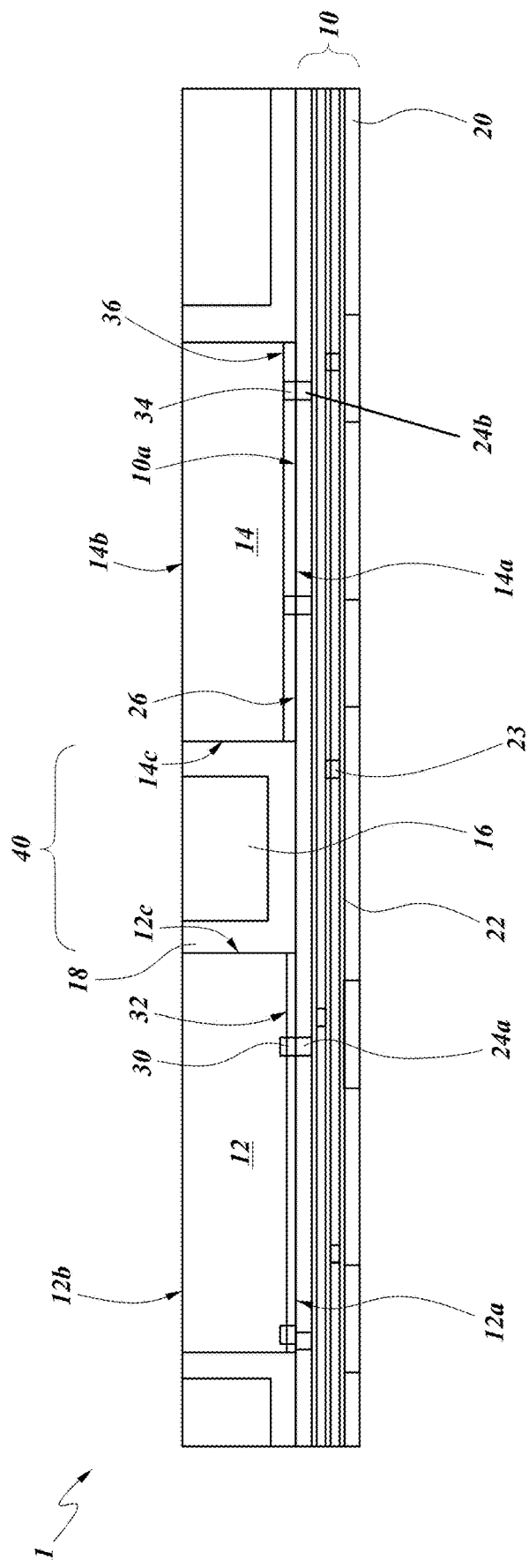

BONDED STRUCTURE WITH INTERCONNECT STRUCTURE

CROSS-REFERENCE TO RELATED APPLICATIONS

This application claims priority to U.S. Provisional Patent Application No. 63/074,928, filed Sep. 4, 2020, titled "BONDED STRUCTURE WITH INTERCONNECT STRUCTURE," the entire contents of each of which are hereby incorporated herein by reference.

BACKGROUND

Field

The field generally relates to bonded structures, and in particular, to bonded structures with an interconnect structure.

Description of the Related Art

A bonded structure can include an electronic component that is mounted to a carrier or a substrate. The bonded structure can include molding material disposed over the electronic component to provide further mechanical support and/or protection for the bonded structure. During manufacturing (and/or operation) of the bonded structure, heat may be applied to the bonded structure. The application of heat (e.g., an annealing process) may impart stresses to the electronic component. Accordingly, there remains a continuing need for improved structures and methods for manufacturing a bonded structure.

BRIEF DESCRIPTION OF THE DRAWINGS

Specific implementations will now be described with reference to the following drawings, which are provided by way of example, and not limitation.

FIG. 1B shows another step in forming the bonded structure.

FIG. 1C shows another step in forming the bonded structure.

FIG. 1D is a schematic cross sectional side view of the bonded structure according to an embodiment.

DETAILED DESCRIPTION

Figure 1A:
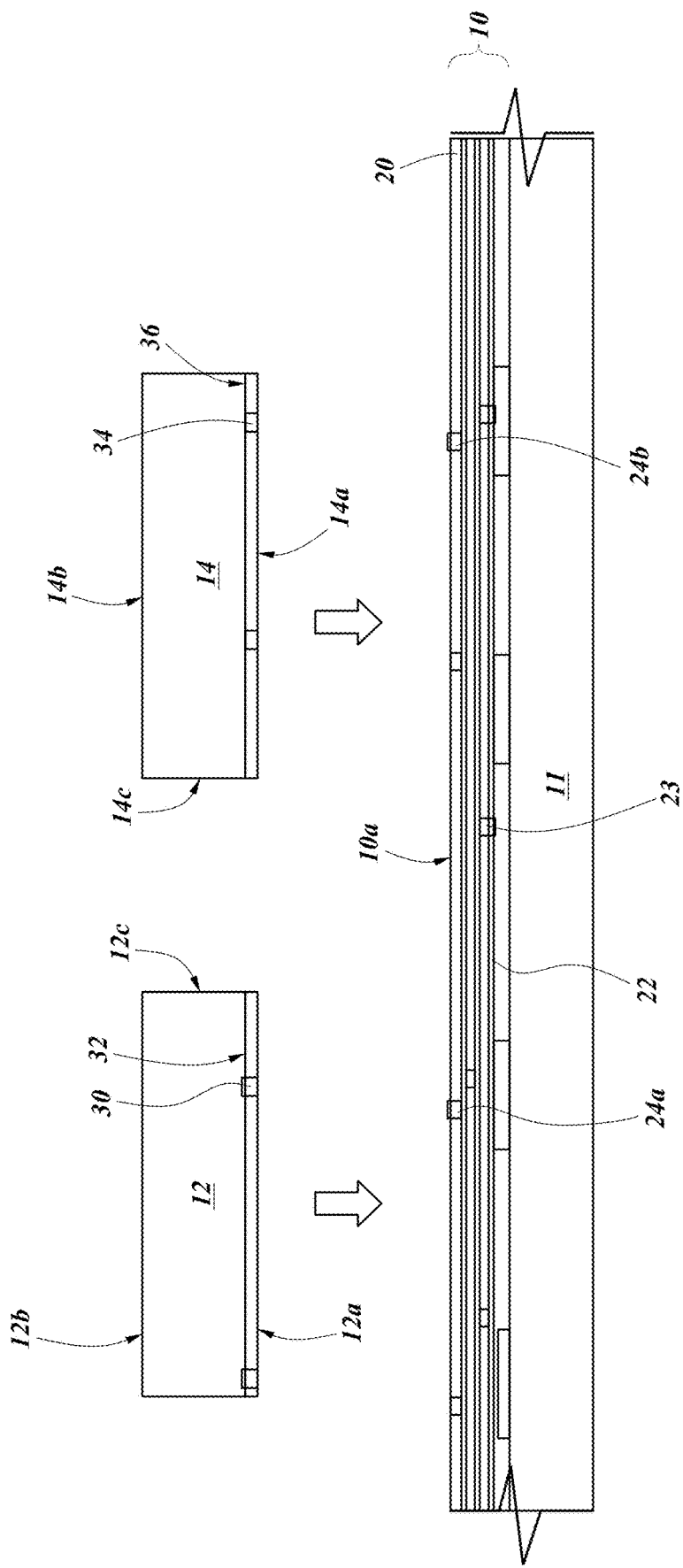
FIG. 1A shows a step in forming a bonded structure.

FIGS. 1A-1D illustrate a manufacturing process for forming a bonded structure 1, according to various embodiments. The resulting bonded structure 1 (see FIG. 1D) can include an electronic component (e.g., an integrated device die) mounted on an interconnect structure 10. For example, a first integrated device die 12 and a second integrated device die 14 can be mounted on the interconnect structure 10. The interconnect structure 10 (e.g., a redistribution layer (RDL)) can route input/output (IO) pads of the electrical component (the first integrated device die 12 and/or the second integrated device die 14) to another location in the bonded structure 1. For example, in some embodiments, the interconnect structure 10 can comprise a fan-out structure in which signals from relatively fine-pitch contact pads of the electrical component are routed out to pads outside the footprint of the component. In some applications, the interconnect structure 10 can allow an electrical communication between two or more dies (e.g., the first integrated device die 12 and the second integrated device die 14) mounted to the interconnect structure 10. A molding material 16 or encapsulant can be provided between the two or more dies (the first integrated device die 12 and the second integrated device die 14) for mechanical support and/or protection. During manufacturing (and/or operation) of the bonded structure 1, the materials may be heated, which can create reliability problems and/or defects due to mismatch of thermal coefficients of expansion. For example, during manufacturing (and/or operation) of the bonded structure 1, heating of the bonded structure can impart stresses near an interface (e.g., an edge) between the integrated device die (the first integrated device die 12 or the second integrated device die 14), the interconnect structure 10, and the molding material 16. In some embodiments, a width of the molding material is less than about 20% of a width of the first integrated die 12 or the second integrate die 14, and preferably less than about 10% of a width of the said dies. For example, the width of the molding material is between 3% to 20%, 5% to 20%, 3% to 10%, or 5% to 10% of the width of the first integrated device die 12 or the second integrated device die 14.

Various embodiments disclosure herein relate to bonded structures having improved reliability when heated, for example, during manufacturing and/or bonding. A bonded structure can include a interconnect structure (e.g., an RDL), a first die bonded to the interconnect structure, a second die bonded to the interconnect structure, and a low coefficient of thermal expansion (CTE) layer disposed between the first die and the second die. The bonded structure can also include a molding material that is disposed between the first die and the second die. The first die and/or the second die can be directly bonded to the interconnect structure without an intervening adhesive.

Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

In some embodiments, the elements (e.g., the first integrated device die 12 and the interconnect structure 10) are directly bonded to one another without an adhesive. In various embodiments, a dielectric field region (e.g., a nonconductive material 32) (also referred to as a nonconductive bonding region) of a first element (e.g., a first semiconductor device die with active circuitry or the first integrated device die 12) can be directly bonded (e.g., using dielectric-to-dielectric bonding techniques) to a corresponding dielectric field region (e.g., a non-conductive material 20) of a second element (e.g., a second semiconductor device die with active circuitry or the interconnect structure 10) without an adhesive. For example, dielectric-to-dielectric bonds may be formed without an adhesive using the direct bonding techniques disclosed at least in U.S. Pat. Nos. 9,564,414; 9,391, 143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of Direct Bond Interconnect, or DBI®, techniques can enable high density of pads connected across the direct bond interface (e.g., small or fine pitches for regular arrays). In some embodiments, the pitch of the bonding pads may be less 40 microns or less than 10 microns or even less than 2 microns. For some applications the ratio of the pitch of the bonding pads to one of the dimensions of the bonding pad is less than 5, or less than 3 and sometimes desirably less than 2. In various embodiments, the contact pads can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

FIG. 1A shows a step in forming a bonded structure 1. In FIG. 1A, an interconnect structure 10 is formed on a carrier 11. The carrier 11 can comprise a wafer in various embodiments. The step in FIG. 1A shows a first integrated device die 12 and a second integrated device die 14 prior to be mounted to the interconnect structure 10. The dies 12, 14 can comprise any suitable type of device die, such as a processor die, a memory die, a sensor die, etc. The dielectric field region (e.g., a non-conductive material 32) can be provided over a bulk semiconductor region (e.g., silicon) of the dies 12, 14.

FIG. 1B shows another step in forming the bonded structure 1. The first integrated device die 12 and the second integrated device die 14 are mounted (e.g., directly bonded without an intervening adhesive) to the interconnect structure 10. Also, in FIG. 1B, a low coefficient of thermal expansion (CTE) dielectric layer 18 is provided. As shown, the dielectric layer 18 can be deposited over upper surfaces of the dies 12, 14, and over the interconnect structure 10 in a space between the dies 12, 14. In some embodiment, the dielectric layer 18 can comprise a conformal coating. In some embodiments, the CTE of dielectric layer 18 may be less than 10 ppm/° C. and less than 6 ppm/° C. and preferably less than 2 ppm/° C. For example, the CTE of dielectric layer 18 may be in a range of 1 ppm/° C. to 10 ppm/° C., in a range of 2 ppm/° C. to 6 ppm/° C., or in a range of 1 ppm/° C. to 2 ppm/° C. The dielectric layer 18 may comprise multiple dielectric layers. Each dielectric layer of the multiple dielectric layer can comprise different CTE. In some embodiments, the thickness of the dielectric layer 18 can be thinner than the thickness of the integrated device die 12, 14. For example, the thickness of the dielectric layer 18 can be less than 50% of the thickness of the integrated device die 12, 14, or the thickness of the dielectric layer 18 can be less than 20% of the thickness of die 12 or 14.

FIG. 1C shows another step in forming the bonded structure 1. At the step in FIG. 1C, a molding material 16 is provided over the dielectric layer 18, including at locations overlying the dies 12, 14 and in the space between the dies 12, 14. The structure 1 shown in FIG. 1C can comprise a reconstituted wafer comprises a plurality of dies 12, 14 mounted to the carrier 11 and at least partially encapsulated with the molding material 16. At least a portion of the CTE dielectric layer 18 over the first integrated device die 12 and/or the second integrated device die can be removed or thinned (e.g., etched or grinded). At least a portion of the molding material 16 over the first integrated device die 12 and/or the second integrated device die can be removed or thinned (e.g., etched or grinded). The structure shown in FIG. 1C can be singulated at the singulation lines 37 to define the bonded structure 1 as shown in FIG. 1D. In some embodiments, the singulation lines 37 can comprise saw streets. The side edges of the bonded structure 1 can comprise a signature indicative of the singulation process, such as saw marking, etch lines, etc.

In some embodiments, the carrier 11 can remain with the interconnect structure until after the application of the molding material 16. However, in some other processes, the carrier 11 can be removed from the interconnect structure 10 at any suitable time, for example, before application of the molding material 16, or before application of the dielectric layer 18. For example, the carrier can be removed from the interconnect structure after the step shown in FIG. 1A and before the step shown in FIG. 1B, after the step shown in FIG. 1B and before the step shown in FIG. 1C, or after the step shown in FIG. 1C and before the step shown in FIG. 1D. In the illustrated embodiment, the carrier 11 is removed after the step shown in FIG. 1C, e.g., after partial removal of the molding material 16 and dielectric layer 18. In some embodiments, the carrier 11 may comprise an optically transparent carrier or plate. The optically transparent carrier may be mechanically coupled to the lower surface of the interconnect structure 10 with for example UV light releasable layer (not shown).

FIG. 1D shows a schematic cross sectional side view of the bonded structure 1 according to an embodiment. In some embodiments, the bonded structure 1 can comprise a singulated reconstituted element that has been singulated from a reconstituted wafer. The bonded structure can comprise an interconnect structure 10, a first integrated device die 12 mounted to the interconnect structure 10, and a second integrated device die 14 mounted to the interconnect structure 10. The interconnect structure 10 can be provided by way of a transfer process. For example, in some embodiments, the interconnect structure 10 (e.g., RDL) can be formed on a carrier (such as a semiconductor or glass carrier) and directly bonded to the dies 12, 14. The carrier can be removed from the interconnect structure 10 to transfer the RDL to the dies 12, 14. Therefore, in some embodiments, the interconnect structure 10 can comprise a transfer RDL. The first and second dies 12, 14 can be spaced apart from one another along the interconnect structure 10. For example, the first and second dies 12, 14 can be aligned to the design of the interconnect structure. The bonded structure 1 can also include a molding material 16 disposed between the first die 12 and the second die 14, and a low coefficient of thermal expansion (CTE) dielectric layer 18. Although there are only two dies 12, 14 illustrated in FIG. 1, the bonded structure 1 can comprise three or more dies, in other embodiments.

In some embodiments, the interconnect structure 10 can comprise a redistribution layer (RDL). In some embodiments, the interconnect structure 10 can serve as an alignment layer by locking and aligning the relative lateral positions of the dies 12, 14 relative to one another. The interconnect structure 10 can comprise a non-conductive material 20, a plurality of conductive lines 22 formed in the non-conductive material 20, a plurality of conductive vias 23 formed in the non-conductive material 20. In some embodiments, a conductive via 23 can extend through a thickness of the non-conductive material 20. The non-conductive material 20 can comprise any suitable material. For example, the non-conductive material 20 can comprise a dielectric material, such as an oxide material (e.g., silicon oxide), a nitride material (e.g., silicon nitride), or amorphous silicon. In some embodiments, the interconnect structure 10 can have an upper contact surface 10a that comprises a plurality of conductive pads (e.g., a first conductive pad 24a and a second conductive pad 24b), and a non-conductive region 26 at least between the first conductive pad 24a and the second conductive pad 24b.

The first integrated device die 12 and/or the second integrated device die 14 can comprise any suitable type of device die. For example, the first integrated device die 12 and/or the second integrated device die 14 can comprise an electronic component such as a processor die, a memory die, a microelectromechanical systems (MEMS) die, an optical device, or any other suitable type of device die. In some embodiments, the first integrated device die 12 and/or the second integrated device die 14 can comprise a stack of a plurality of dies. In other embodiments, the electronic component can comprise a passive device such as a capacitor, inductor, or other surface-mounted device. Circuitry (such as active components like transistors) can be patterned at or near active surface(s) of the first integrated device die 12 and/or the second integrated device die 14 in various embodiments. The active surfaces may be on a side of the first integrated device die 12 and/or the second integrated device die 14 which is opposite respective backsides of the dies first integrated device die 12 and/or the second integrated device die 14. The backsides may or may not include any active circuitry or passive devices. The first integrated device die 12 and the second integrated device die 14 may be the same type of integrated device die or a different type of device die.

The first die 12 can comprise a bonding surface 12a and an upper surface 12b opposite the bonding surface 12a. The bonding surface 12a can have a conductive bond pad 30, and a non-conductive material 32 proximate to the conductive bond pad 30. In some embodiments, the conductive bond pad 30 can be bonded to the first conductive pad 24a, and the non-conductive material 32 can be bonded to a portion of the non-conductive region 26. In some embodiments, the conductive bond pad 30 can be directly bonded to the first conductive pad 24a without an intervening adhesive, and the non-conductive material 32 can be directly bonded to the portion of the non-conductive region 26 without an intervening adhesive. The non-conductive materials 32, 36 and conductive bond pads 30, 24 can be directly bonded without an adhesive as described below.

The second die 14 can comprise a bonding surface 14a and a back surface 14b opposite the bonding surface 14a. The bonding surface 14a can have a conductive bond pad 34, and a non-conductive material 36 proximate to the conductive bond pad 34. In some embodiments, the conductive bond pad 34 can be bonded to the second conductive pad 24b, and the non-conductive material 36 can be bonded to a portion of the non-conductive region 26. In some embodiments, the conductive bond pad 34 can be directly bonded to the second conductive pad 24b without an intervening adhesive, and the non-conductive material 36 can be directly bonded to the portion of the non-conductive region 26 without an intervening adhesive.

In some embodiments, the first integrated device die 12 and/or the second integrated device die 14 can be bonded to the interconnect structure 10 such that, the active surface(s) of the first integrated device die 12 and/or the second integrated device die 14 face the interconnect structure 10. In some embodiments, the first integrated device die 12 and/or the second integrated device die 14 can be bonded to the interconnect structure 10 such that, the active surface(s) of the first integrated device die 12 and/or the second integrated device die 14 face away the interconnect structure 10. In some embodiments, the active surface of one of the first integrated device die 12 and the second integrated device die 14 faces the interconnect structure 10 and the active surface of the other one of the first integrated device die 12 and the second integrated device die 14 faces away the interconnect structure 10. In the illustrated embodiment, the dielectric layer 18 and the non-conductive material 32 can be flush with the upper surface of the interconnect structure 10. The non-conductive material 32 can accordingly extend along side surfaces of the bulk portion of the dies 12, 14 and along side surfaces of the non-conductive material 32.

The molding material 16 can comprise a polymer, epoxy, resin, or the like material. In some embodiments, the molding material 16 provide mechanical support for the first integrated device die 12 and/or the second integrated device die 14. In some embodiments, the molding material 16 can at least partially fill a gap 40 between the first integrated device die 12 and the second integrated device die 14. The CTE of the molding material 16 may be relatively high such that the molding material 16 may expand when heated, which can induce stresses in the dies 12, 14 and/or the interconnect structure 10.

The low CTE layer 18 can comprise any suitable material. In some embodiments, the low CTE layer 18 can have a CTE that is equal to or lower than that of the non-conductive material 20 of the interconnect structure 10, the non-conductive material 32 of the first die 12, or the non-conductive material 36 of the second die 14. In some embodiments, the low CTE layer 18 can have a CTE that is lower than that of the molding material 16. In some embodiments, the low CTE layer 18 can comprise a dielectric layer. For example, the low CTE layer 18 can comprise a silicon oxide layer. The use of a low CTE layer 18 can reduce the overall thermal mismatch between the molding material 16 and the other components of the structure. The layer 18 can comprise a material that is different from or the same as non-conductive material 32. The layer 18 can be a different material from the molding material 16. The low CTE layer 18 can beneficially reduce and/or remove stresses at the first die 12, the interconnect structure 10, and the molding material 16 during manufacture (or operation) relative to a similar bonded structure without a low CTE layer. In some embodiments, the low CTE layer 18 can have a thickness in a range of, for example, 1 µm to 10 µm, in a range of, for example, 1 µm to 5 µm, in a range of, for example, 3 µm to 10 µm, in a range of, for example, 5 µm to 10 µm, or in a range of, for example, 3 µm to 5 µm.

In some embodiments, the low CTE layer 18 can be disposed along at least a portion of a sidewall 12c of the first integrated device die 12. In the illustrated embodiment, the layer 18 may be disposed only along the sidewall 12c, e.g., not along the upper surface 12b of the integrated device die 12. In some embodiments, a majority of the upper surface 12b of the integrated device die 12 can be free from the low CTE layer 18. In some embodiments, the low CTE layer 18 can be disposed along at least a portion of a sidewall 14c of the second integrated device die 14. In some embodiments, the low CTE layer 18 can be applied to the upper surface 12b and the sidewall 12c of the die 12, and the low CTE layer 18 can be removed from the upper surface 12b by, for example, lapping. In the illustrated embodiment, the layer 18 may be disposed only along the sidewall 14c, e.g., not along the upper surface of the die 14. In some embodiments, the low CTE layer 18 can be disposed along at least a portion of the upper contact surface 10a of the interconnect structure 10. In some embodiments, the low CTE layer 18 can comprise a conformal layer that conform with surfaces of the first die 12, second die 14, and the interconnect structure 10. In some embodiments, the low CTE layer 18 can separate the molding material 16 from surfaces of the first die 12, second die 14, and the interconnect structure 10. In some embodiments, the low CTE layer 18 completely separates the molding material 16 from the interconnect structure 10 such that no portion of the molding material directly contacts the interconnect structure 10. In some embodiments, the low CTE layer 18 can have a CTE in a range of, for example, 3 ppm to 7 ppm, in a range of, for example, 3 ppm to 5 ppm, in a rage of, for example, 5 ppm to 7 ppm.

In some embodiments, the low CTE layer 18 can improve rigidity of the bonded structure 1. In some embodiments, the low CTE layer 18 can provide more reliability during manufacture (and/or operation) of the bonded structure 1 than a similar bonded structure without a low CTE layer. A similar bonded structure without the low CTE layer can have a high stress region at a three point corner or edge between its die, interconnect structure, and molding material. In the bonded structure 1, the low CTE layer 18 can move or shift the high stress region from the three point corner to a region near a corner between the CTE layer 18 and the interconnect structure 10 thereby reducing the stress applied to the first die 12 or the second die 14. For example, the low CTE layer 18 can reduce stress applied to the first and second dies 12, 14 during manufacturing (and/or operation) of the bonded structure.

Bonding surfaces (e.g., the upper contact surface 10a, the bonding surface 12a, and the bonding surface 14a) can be polished or planarized, activated, and terminated with a suitable species. For example, in various embodiments, one or more of the non-conductive region 26, the non-conductive material 32 at the bonding surface 12a, and the conductive bond pad 34 (e.g., non-conductive material) at the bonding surface 14a may comprise an inorganic dielectric material, for example, silicon oxide. The bonding surfaces can be polished to a root-mean-square (rms) surface roughness of less than 2 nm, e.g., less than 1 nm, less than 0.5 nm, etc. The polished bonding surfaces can be activated by for example, a process comprising atmospheric or a vacuum plasma method. In various embodiments, the bonding surfaces can be terminated with nitrogen, for example, by way of wet or dry etching (e.g., very slight etching (VSE)) using, for example, a nitrogen-containing solution or by using a plasma etch with nitrogen. In some embodiments, a portion of the non-conductive region 26 and the non-conductive material 32 at the bonding surface 12a can be brought into contact to form a direct bond at room temperature without application of external pressure and without an adhesive. In some embodiments, a non-conductive region 26 and the conductive bond pad 34 at the bonding surface 14a can be brought into contact to form a direct bond at room temperature without application of external pressure and without an adhesive.

In some embodiments, the bonded structure 1 can be heated further to improve the bond strength between the opposing bonding surfaces of the interconnect structure 10 and the first die 12 and/or the second die 14, and to form reliable electrical and mechanical contact at the interface between the interconnect structure 10 and the first die 12 or the second die 14. For example, in some embodiments, the respective contact pads 24a, 24b, and conductive bond pads 30, 34 can be flush with the surface of the respective non-conductive region 26 and non-conductive materials 32, 36, or can be recessed below the non-conductive region 26 and non-conductive materials 32, 36, for example, recessed in a range of 0 nm to 20 nm, or in a range of 4 nm to 10 nm. Portions of the non-conductive region 26 and the non-conductive materials 32, 36 can be directly bonded to one another without an adhesive at room temperature and, subsequently, the bonded structure 1 can be annealed. Upon annealing, the contact pads 24a, 24b, and conductive bond pads 30, 34 can expand and contact one another to form a metal-to-metal direct bond. The metal-to-metal direct bonds can provide an electrical and a mechanical connection between the opposing bonding surfaces of the interconnect structure 10 and the first die 12 and/or the second die 14. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes.

Figure 1E:
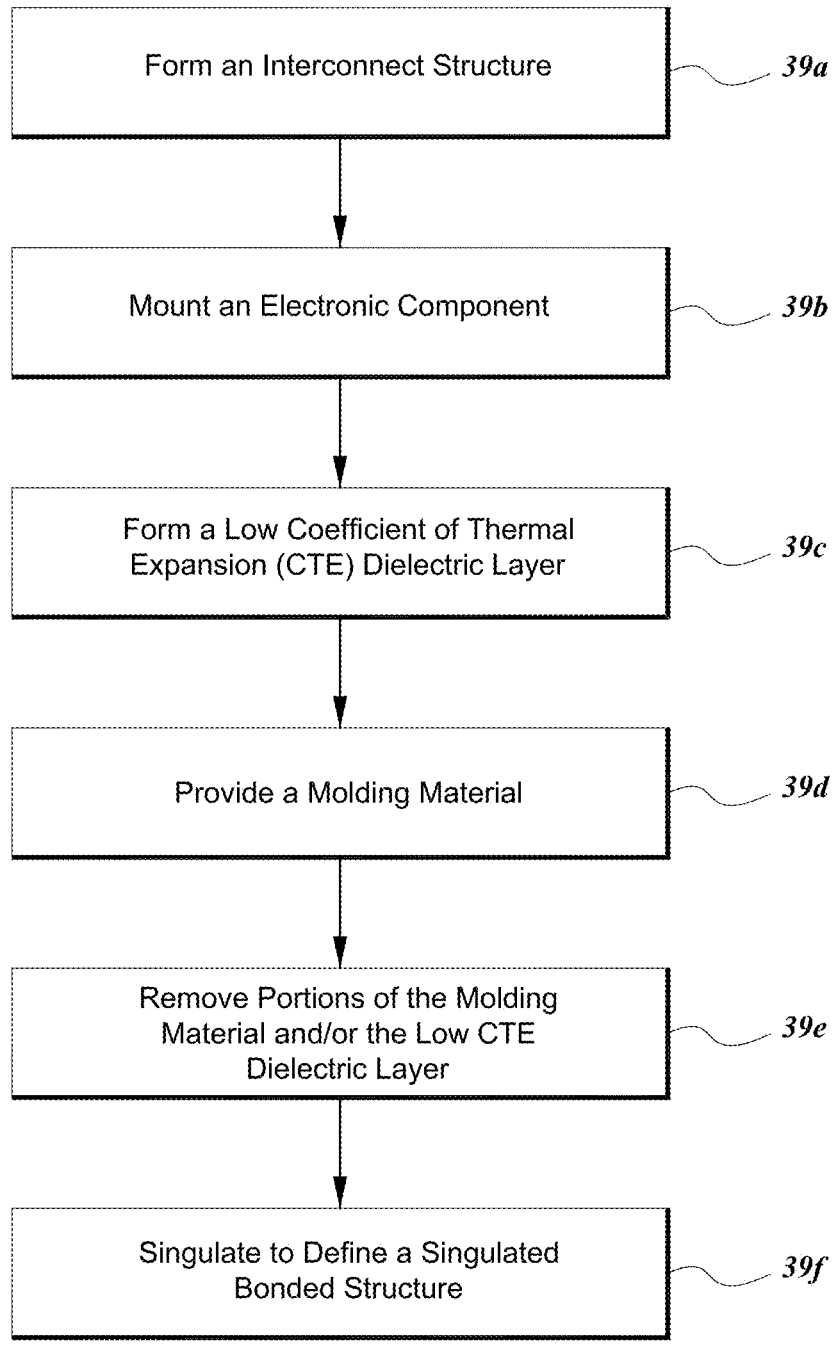
FIG. 1E is a flow chart showing steps for forming a bonded structure according to an embodiment.

FIG. 1E is a flow chart showing steps for forming a bonded structure according to an embodiment. At a step 39a (also see FIG. 1A), an interconnect structure 10 can be formed and provided. The interconnect structure 10 can be provided by way of a transfer process. For example, in some embodiments, the interconnect structure 10 (e.g., an RDL) can be formed on a carrier 11 (such as a semiconductor or glass carrier). At a step 39b (also see FIG. 1B), an electronic component (e.g., an integrated device die 12, 14) can be mounted to the interconnect structure 10. At a step 39c (also see FIG. 1B), a low coefficient of thermal expansion (CTE) dielectric layer 18 can be provided. In some embodiments the low CTE dielectric layer 18 can comprise an inorganic dielectric material, such as a silicon oxide layer. In some embodiments, the low CTE dielectric layer 18 can be provided by way of deposition. At a step 39d (also see FIG. 1C), a molding material 16 can be provided. In some embodiments, the molding material 16 can comprise a polymer, epoxy, resin, liquid crystal polymer or the like material. The low CTE dielectric layer 18 can comprise a material that has a CTE that is lower than a CTE of the molding material 16. At a step 39e, at least a portion of the CTE dielectric layer 18 over electronic component can be removed or thinned (e.g., etched or grinded). At the step 39e, at least a portion of the molding material 16 over the electronic component can be removed or thinned (e.g., etched or grinded). At a step 39f (also see FIGS. 1C and 1D), the resulting structure can be singulated to define the singulated bonded structure 1. As described above, in some embodiments, a width of the molding material is less than 20% of a width of the first integrated die 12 or the second integrate die 14, and preferably less than 10% of a width of the said dies.

The carrier 11 can be removed from the interconnect structure 10 to transfer the RDL to the electronic component (e.g., the first integrated device die 12) at any suitable time in the manufacturing process. For example, the carrier 11 can be removed from the interconnect structure 10 after the step 39a and before the step 39b, after the step 39b and before the step 39c, after the step 39c and before the step 39d, after the step 39d and before the step 39e, after the step 39e and before the step 39f, or after the step 39f.

Figure 2:
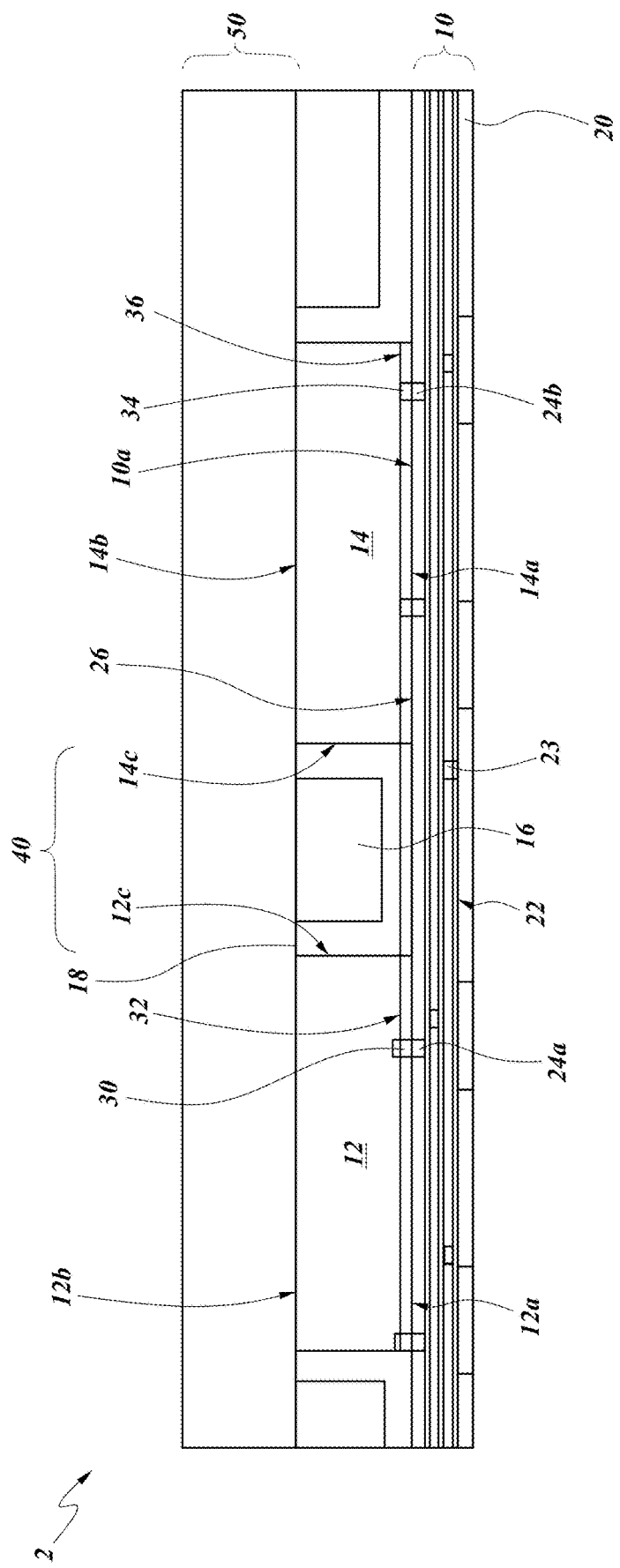
FIG. 2 is a schematic cross sectional side view of a bonded structure according to another embodiment.

FIG. 2 shows a schematic cross sectional side view of a bonded structure 2 according to an embodiment. Unless otherwise noted, the components of FIG. 2 may be the same as or generally similar to like-numbered components of FIG. 1. The bonded structure can comprise an interconnect structure 10, a first integrated device die 12 mounted to the interconnect structure 10, and a second integrated device die 14 mounted to the interconnect structure 10. The bonded structure 2 can also include a molding material 16 disposed between the first die 12 and the second die 14, and a low coefficient of thermal expansion (CTE) layer 18. The bonded structure 2 can further include a support structure 50.

The support structure 50 can comprise any suitable material for supporting the first integrated device die 12 and/or the second integrated device die 14, such as a silicon handle wafer or other structure. The support structure 50 can be positioned such that the first integrated device die 12 and the second integrated device die 14 are positioned between the support structure 50 and the interconnect structure 10.

In some embodiments, the support structure 50 can comprise a third integrated device die. In such embodiments, the support structure may provide an electrical connection between the first integrated device die 12 and the second integrated device die 14. Also, the third integrated device die can electrically connect to the interconnect structure 10 by way of a via (not illustrated) formed in the first integrated device die 12, the second integrated deice die 14, or the molding material 16.

Figure 3:
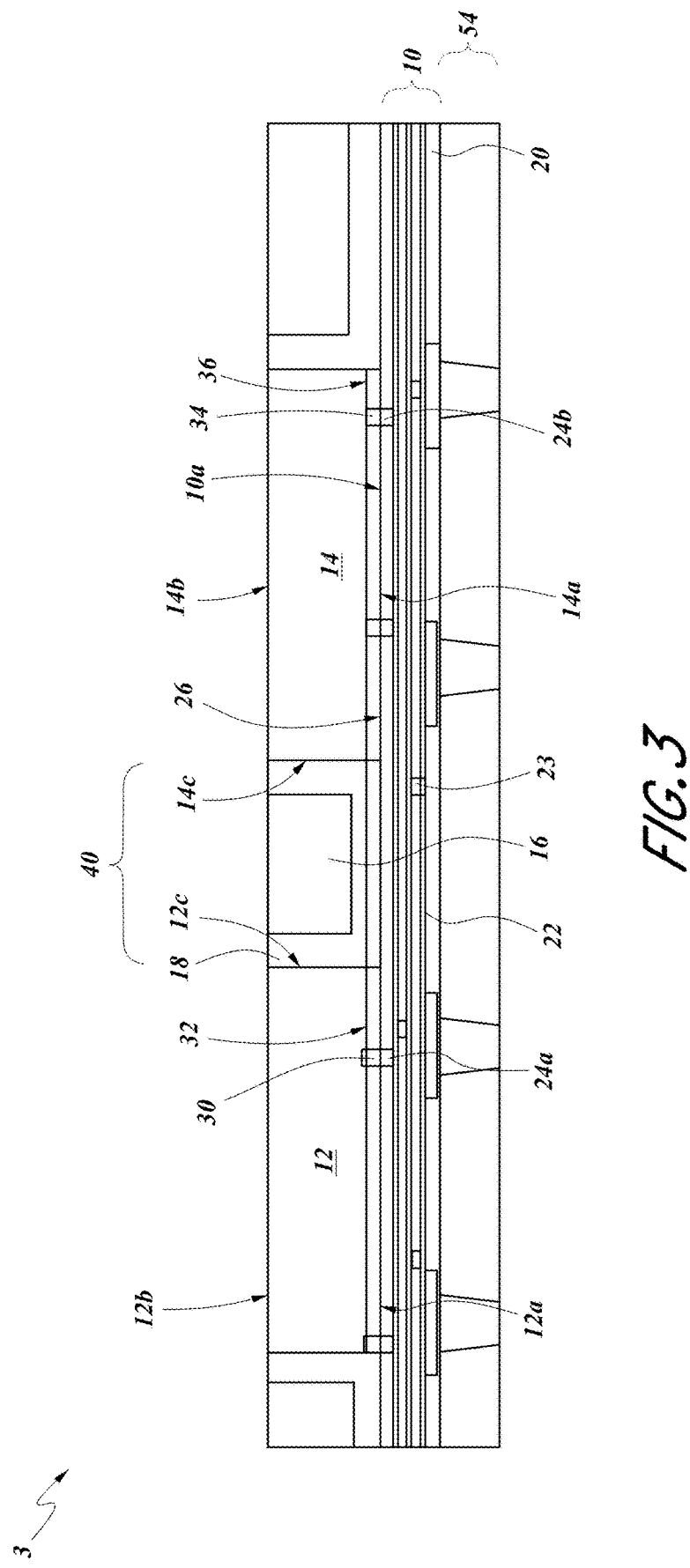
FIG. 3 is a schematic cross sectional side view of a bonded structure according to another embodiment.

FIG. 3 shows a schematic cross sectional side view of a bonded structure 3 according to an embodiment. Unless otherwise noted, the components of FIG. 3 may be the same as or generally similar to like-numbered components of FIGS. 1A-2. The bonded structure can comprise an interconnect structure 10, a first integrated device die 12 mounted to the interconnect structure 10, and a second integrated device die 14 mounted to the interconnect structure 10. The support structure 50 can be removed from the structure of FIG. 2 to form the structure 3 of FIG. 3. The bonded structure 2 can also include a molding material 16 disposed between the first die 12 and the second die 14, and a low coefficient of thermal expansion (CTE) layer 18. The bonded structure 2 can further include a substrate 54.

The substrate 54 can comprise a conductive via 56 the extends at least partially through the substrate. In some embodiments, the via 56 can be electrically coupled with the first integrated deice die 12 and/or the second integrated device die 14 through the interconnect structure 10. The substrate 54 can comprise any suitable material. In some embodiments, the substrate 54 can comprise a semiconductor die.

Figure 4:
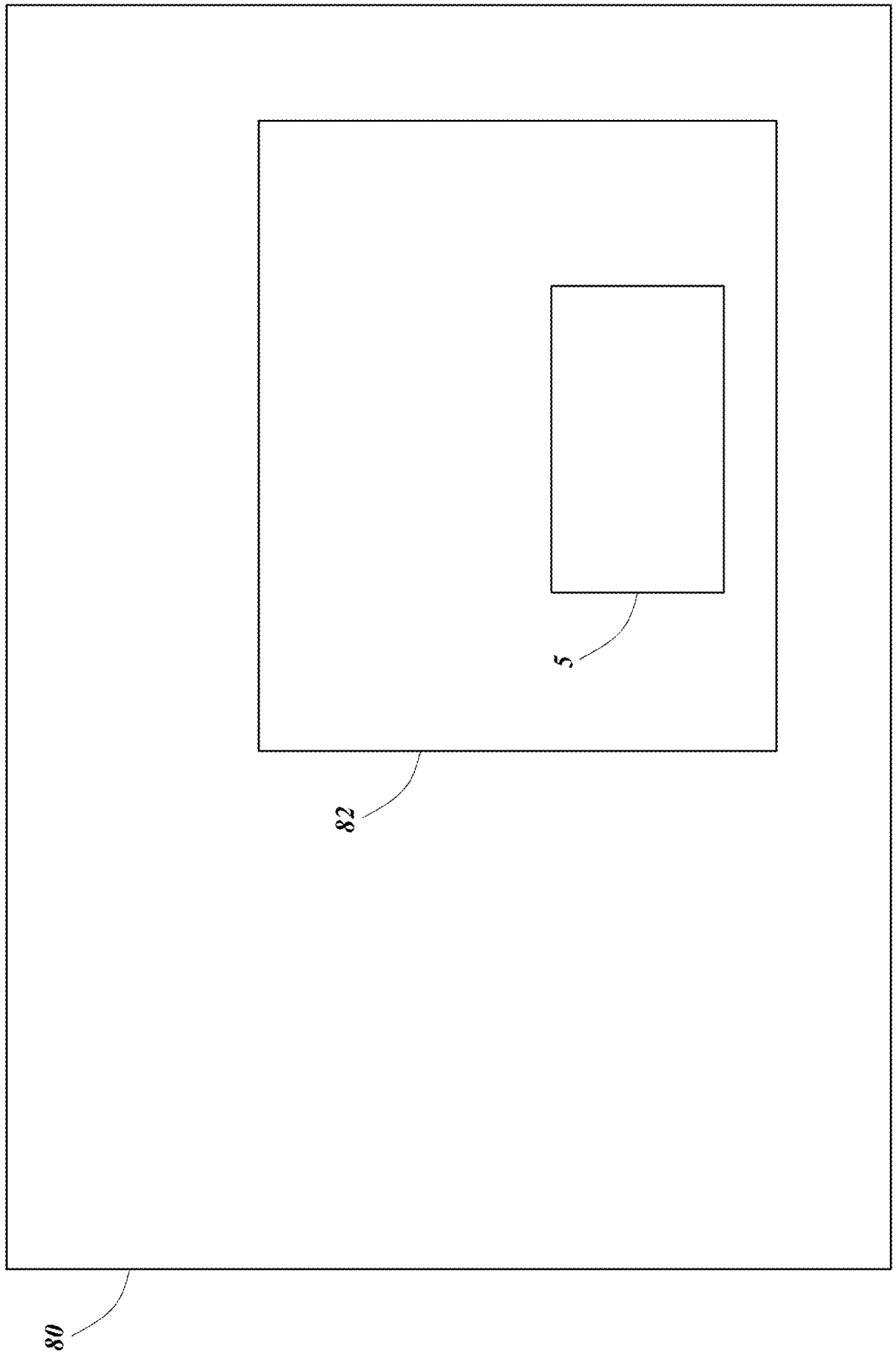
FIG. 4 is a schematic diagram of a system incorporating one or more microelectronic assemblies, according to various embodiments.

FIG. 4 is a schematic diagram of a system 80 incorporating one or more bonded structure 5, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 5. The bonded structures 5 shown in FIG. 4 can comprise any of the bonded structure disclosed herein. The bonded structure 5 can include one or more integrated device dies which perform various functions for the system 80.

In one embodiment, a bonded structure is disclosed. The bonded structure can include an interconnect structure that has conductors at least partially embedded in a non-conductive material and an upper surface. The upper surface includes a first conductive pad, a second conductive pad, and a non-conductive region. The bonded structure can also include a first integrated device die that has a first bonding surface. The first bonding surface includes a first conductive bond pad and a first non-conductive material. The first conductive bond pad is directly bonded to the first conductive pad without an intervening adhesive. The first non-conductive material can be directly bonded to a first portion of the non-conductive region. The bonded structure can further include a second integrated device die that is mounted to the interconnect structure. The second integrated device die can be spaced apart from the first integrated device die laterally along the upper surface of the interconnect structure. The second integrated device die can be electrically connected with the first integrated device die through at least the interconnect structure. The bonded structure can further include a dielectric layer that is disposed over the upper surface of the interconnect structure between the first integrated device die and the second integrated device die.

In one embodiment, the bonded structure further includes a molding material positioned over the dielectric layer between the first integrated device die and the second integrated device die.

In one embodiment, the dielectric layer has a coefficient of thermal expansion (CTE) lower than a CTE of the molding material In one embodiment, the interconnect structure includes a transfer redistribution layer (RDL).

In one embodiment, the dielectric layer comprises a silicon oxide layer.

In one embodiment, the dielectric layer is disposed between the molding material and the first integrated device die and between the molding material and a portion of the upper surface of the interconnect structure.

In one embodiment, the dielectric layer is disposed along a sidewall of the first integrated device die, a portion of the upper surface of the interconnect structure, and a sidewall of the second integrated device die.

In one embodiment, the first bonding surface of the first integrated device die comprises an active surface of the first integrated device die.

The second integrated device die can include a back side opposite the second bonding surface. The back side of the second integrated device die comprises an active surface of the second integrated device die.

In one embodiment, the bonded structure further includes a support structure that is coupled to the first integrated device die and the second integrated device die such that the first integrated device die and the second integrated device die are positioned between the interconnect structure and the support structure.

In one embodiment, the interconnect structure includes a first conductive line connected to the first conductive pad by way of a first conductive via, and a second conductive line connected to the second conductive pad by way of a second conductive via.

In one embodiment, the second integrated device die comprises a second bonding surface. The second bonding surface can include a second conductive bond pad and a second non-conductive material. The second conductive bond pad can be bonded to the second conductive pad. The second non-conductive material can be bonded to a second portion of the non-conductive region that is different from the first portion.

In one embodiment, the second conductive bond pad is directly bonded to the second conductive pad without an intervening adhesive, and the second non-conductive material is directly bonded to a second portion of the non-conductive region different from the first portion without an intervening adhesive.

In one aspect, a bonded structure is disclosed. The bonded structure can include an interconnect structure that has conductors at least partially embedded in a non-conductive material and an upper surface. The upper surface includes a first conductive pad, a second conductive pad in electrical communication with the first conductive pad, and a non-conductive region. The bonded structure can also include a first integrated device die that has a first bonding surface. The first bonding surface can include a first conductive bond pad and a first non-conductive material. The first conductive bond pad can be directly bonded to the first conductive pad without an intervening adhesive. The first non-conductive material can be directly bonded to a first portion of the non-conductive region. The bonded structure can also include a second integrated device die that is mounted to the interconnect structure. The second die can be spaced apart from the first integrated device die laterally along the upper surface of the interconnect structure. The bonded structure can also include a molding material that is disposed between the first integrated device die and the second integrated device die. The bonded structure can further include a dielectric layer that is disposed at least between the molding material and the first integrated device die or between the molding material and the upper surface of the interconnect structure.

In one embodiment, the dielectric layer has a coefficient of thermal expansion that is (CTE) lower than a CTE of the molding material In one embodiment, the interconnect structure comprises a transfer redistribution layer (RDL).

In one embodiment, the dielectric layer includes a silicon oxide layer.

In one embodiment, the dielectric layer is disposed between the molding material and the first integrated device die and between the molding material and a portion of the upper surface of the interconnect structure. The dielectric layer can be disposed along a sidewall of the first integrated device die, a portion of the upper surface of the interconnect structure, and a sidewall of the second integrated device die.

In one embodiment, the first bonding surface of the first integrated device die includes an active surface of the first integrated device die. The second integrated device die can include a back side opposite the second bonding surface. The back side of the second integrated device die can include an active surface of the second integrated device die.

In one embodiment, the bonded structure further includes a support structure that is coupled to the first integrated device die and the second integrated device die such that the first integrated device die and the second integrated device die are positioned between the interconnect structure and the support structure.

In one embodiment, the interconnect structure includes a first conductive line connected to the first conductive pad by way of a first conductive via, and a second conductive line connected to the second conductive pad by way of a second conductive via.

In one embodiment, the second die comprises a second bonding surface. The second bonding surface can include a second conductive bond pad and a second non-conductive material. The second conductive bond pad can be bonded to the second conductive pad, and the second non-conductive material can be bonded to a second portion of the non-conductive region different from the first portion. The second conductive bond pad can be directly bonded to the second conductive pad without an intervening adhesive, and the second non-conductive material can be directly bonded to a second portion of the non-conductive region different from the first portion without an intervening adhesive.

In one embodiment, the second integrated device die is electrically connected with the first integrated device die at least partially through the interconnect structure.

In one embodiment, a method of manufacturing a bonded structure is disclosed. The method can include providing an interconnect structure that has conductors at least partially embedded in a non-conductive material and an upper surface. The upper surface includes a first conductive pad, a second conductive pad, and a non-conductive region. The method can also include directly bonding a first integrated device die to the interconnect structure. The first integrated device die has a first bonding surface. The first bonding surface can include a first conductive bond pad and a first non-conductive material. The first conductive bond pad can be directly bonded to the first conductive pad without an intervening adhesive, and the first non-conductive material can be directly bonded to a first portion of the non-conductive region. The method can also include directly bonding a second integrated device die to the interconnect structure. The second integrated device die can be spaced apart from the first integrated device die laterally along the upper surface of the interconnect structure. The second integrated device die can be electrically connected with the first integrated device die through at least the interconnect structure. The method can also include forming a dielectric layer over at least a portion of the upper surface of the interconnect structure. The method can further include disposing a molding material over at least a portion of the dielectric layer.

In one embodiment, forming the interconnect structure includes forming the interconnect structure on a carrier. The method can further include removing the carrier from the interconnect structure after mounting the first integrated device die.

In one embodiment, forming the dielectric layer include forming the dielectric layer along a sidewall of the first die, a portion of the upper surface, and a sidewall of the second die.

In one aspect, a bonded structure is disclosed. The bonded structure can include an interconnect structure that has conductors at least partially embedded in a non-conductive material and a upper surface. The upper surface includes a first conductive pad, a second conductive pad, and a non-conductive region between the first conductive pad and the second conductive pad. The bonded structure can also include a first die that has a first bonding surface. The first bonding surface can include a first conductive bond pad and a first non-conductive material. The first bonding surface of the first die can include an active surface of the first die. The first conductive bond pad can be directly bonded to the first conductive pad without an intervening adhesive, and the first non-conductive material can be directly bonded to a first portion of the non-conductive region. The bonded structure can also include a second die that has a second bonding surface facing the interconnect structure. The second die can be mounted to the interconnect structure. The second die can be spaced apart from the first die laterally along the upper surface of the interconnect structure. The second die includes a back side opposite the second bonding surface. The back side of the second die can include an active surface of the second die. The bonded structure can also include a molding material disposed between the first die and the second die. The bonded structure can further include a silicon oxide layer that is disposed between the molding material and the first die or between the molding material and the upper surface of the interconnect structure.

In one embodiment, the interconnect structure includes a redistribution layer, and the first die and the second die are electrically connected with each other at least partially through the interconnect structure.

In one embodiment, the silicon oxide layer is disposed between the molding material and the first die and between the molding material and a portion of the upper surface of the interconnect structure.

In one embodiment, the silicon oxide layer is disposed along a sidewall of the first die, a portion of the upper surface, and a sidewall of the second die.

In one embodiment, the interconnect structure includes a first conductive line connected to the first conductive pad by way of a first conductive via, and a second conductive line connected to the second conductive pad by way of a second conductive via.

In one embodiment, the second bonding surface includes a second conductive bond pad and a second non-conductive material, the second conductive bond pad bonded to the second conductive pad, and the second non-conductive material bonded to a second portion of the non-conductive region different from the first portion.

In one aspect, a bonded structure is disclosed. The bonded structure can include an interconnect structure that has conductors at least partially embedded in a non-conductive material and a upper surface. The upper surface can include a first conductive pad, a second conductive pad, and a non-conductive region surrounding the first conductive pad and the second conductive pad. The bonded structure can also include a first die having a first bonding surface. The first bonding surface can include a first conductive bond pad and a first non-conductive material surrounding the first conductive bond pad. The first bonding surface of the first die can include an active surface of the first die. The first conductive bond pad can be directly bonded to the first conductive pad, and the first non-conductive material can be directly bonded to a first portion of the non-conductive region. The bonded structure can also include a second die that has a second bonding surface facing the interconnect structure. The second die can be mounted to the interconnect structure. The second die can be spaced apart from the first die laterally along the upper surface of the interconnect structure. The bonded structure can further include a molding material disposed between the first die and the second die. A width of the molding material is less than 20% of a width of the first die or second die.

In one aspect, a bonded structure is disclosed. the bonded structure can include an interconnect structure that has conductors at least partially embedded in a non-conductive material and a upper surface. The upper surface includes a first conductive pad, a second conductive pad, and a non-conductive region surrounding the first conductive pad and the second conductive pad. The bonded structure can also include a first die that has a first bonding surface. The first bonding surface can include a first conductive bond pad and a first non-conductive material surrounding the first conductive bond pad. The first bonding surface of the first die can include an active surface of the first die. The first conductive bond pad can be directly bonded to the first conductive pad, and the first non-conductive material can be directly bonded to a first portion of the non-conductive region. The bonded structure can further include a second die that has a second bonding surface facing the interconnect structure. The second die can be mounted to the interconnect structure. The second die can be spaced apart from the first die laterally along the upper surface of the interconnect structure. A thickness of the interconnect structure is thinner than a thickness of the first die or the second die. The thickness of the interconnect structure can be less than 50% of the thickness of the first die or the second die.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:
an interconnect structure having conductors at least partially embedded in a non-conductive material and an upper surface, the upper surface comprising a first conductive pad, a second conductive pad, and a non-conductive region;
a first integrated device die having a first bonding surface, the first bonding surface comprising a first conductive bond pad and a first non-conductive material, the first conductive bond pad directly bonded to the first conductive pad without an intervening adhesive, and the first non-conductive material directly bonded to a first portion of the non-conductive region;
a second integrated device die mounted to the interconnect structure, the second integrated device die spaced apart from the first integrated device die laterally along the upper surface of the interconnect structure, the second integrated device die electrically connected with the first integrated device die through at least the interconnect structure; and
a dielectric layer disposed over the upper surface of the interconnect structure between the first integrated device die and the second integrated device die,
wherein the interconnect structure comprises a transfer redistribution layer (RDL), a lower surface of the interconnect structure opposite the upper surface comprising a direct hybrid bonding surface.

2. The bonded structure of claim 1, further comprising an encapsulant over the dielectric layer between the first integrated device die and the second integrated device die.

3. The bonded structure of claim 2, wherein the dielectric layer has a coefficient of thermal expansion (CTE) lower than a CTE of the encapsulant.

4. The bonded structure of claim 2, wherein the dielectric layer is disposed between the encapsulant and the first integrated device die and between the encapsulant and a portion of the upper surface of the interconnect structure, the dielectric layer is disposed along a sidewall of the first integrated device die, a portion of the upper surface of the interconnect structure, and a sidewall of the second integrated device die.

5. The bonded structure of claim 1, wherein the lower surface of the interconnect structure is directly hybrid bonded to a carrier.

6. The bonded structure of claim 1, wherein the first bonding surface of the first integrated device die comprises an active surface of the first integrated device die.

7. The bonded structure of claim 1, further comprising a support structure coupled to the first integrated device die and the second integrated device die such that the first integrated device die and the second integrated device die are positioned between the interconnect structure and the support structure.

8. The bonded structure of claim 1, wherein the interconnect structure comprises a first conductive line connected to the first conductive pad by way of a first conductive via, and a second conductive line connected to the second conductive pad by way of a second conductive via.

9. The bonded structure of claim 1, wherein the second integrated device die comprises a second bonding surface, the second bonding surface comprising a second conductive bond pad and a second non-conductive material, the second conductive bond pad bonded to the second conductive pad, and the second non-conductive material bonded to a second portion of the non-conductive region different from the first portion, the second conductive bond pad is directly bonded to the second conductive pad without an intervening adhesive, and the second non-conductive material directly bonded to a second portion of the non-conductive region different from the first portion without an intervening adhesive.

10. A bonded structure comprising:
an interconnect structure having conductors at least partially embedded in a non-conductive material, an upper surface, and a lower surface opposite the upper surface, the upper surface comprising a first conductive pad, a second conductive pad in electrical communication with the first conductive pad, and a non-conductive region, the lower surface comprising a direct hybrid bonding surface;
a first integrated device die having a first bonding surface, the first bonding surface comprising a first conductive bond pad and a first non-conductive material, the first conductive bond pad directly bonded to the first conductive pad without an intervening adhesive, and the first non-conductive material directly bonded to a first portion of the non-conductive region;
a second integrated device die mounted to the interconnect structure, the second die spaced apart from the first integrated device die laterally along the upper surface of the interconnect structure;
an encapsulant disposed between the first integrated device die and the second integrated device die;
a dielectric layer disposed at least between the encapsulant and the first integrated device die or between the encapsulant and the upper surface of the interconnect structure; and
a carrier, the direct hybrid bonding surface of the lower surface of the interconnect structure directly hybrid bonded to the carrier.

11. The bonded structure of claim 10, wherein the dielectric layer has a coefficient of thermal expansion (CTE) lower than a CTE of the encapsulant.

12. The bonded structure of claim 10, wherein the dielectric layer is disposed between the encapsulant and the first integrated device die and between the encapsulant and a portion of the upper surface of the interconnect structure.

13. The bonded structure of claim 10, further comprising a support structure coupled to the first integrated device die and the second integrated device die such that the first integrated device die and the second integrated device die are positioned between the interconnect structure and the support structure.

14. A bonded structure comprising:
an interconnect structure having conductors at least partially embedded in a non-conductive material, a upper surface, and a lower surface opposite the upper surface, the upper surface comprising a first conductive pad, a second conductive pad, and a non-conductive region between the first conductive pad and the second conductive pad, the lower surface comprising a direct hybrid bonding surface;
a first die having a first bonding surface, the first bonding surface comprising a first conductive bond pad and a first non-conductive material, the first bonding surface of the first die comprising an active surface of the first die, the first conductive bond pad directly bonded to the first conductive pad without an intervening adhesive, and the first non-conductive material directly bonded to a first portion of the non-conductive region;
a second die having a second bonding surface facing the interconnect structure, the second die mounted to the interconnect structure, the second die spaced apart from the first die laterally along the upper surface of the interconnect structure, the second die comprising a back side opposite the second bonding surface, the back side of the second die comprises an active surface of the second die;
an encapsulant disposed between the first die and the second die; and
a silicon oxide layer disposed between the encapsulant and the first die or between the encapsulant and the upper surface of the interconnect structure,
wherein the interconnect structure comprises a transfer redistribution layer (RDL).

15. The bonded structure of claim 14, wherein the lower surface of the interconnect structure is directly hybrid bonded to a carrier, and the first die and the second die are electrically connected with each other at least partially through the interconnect structure.

16. The bonded structure of claim 14, wherein the silicon oxide layer is disposed between the encapsulant and the first die and between the encapsulant and a portion of the upper surface of the interconnect structure.

17. The bonded structure of claim 14, wherein the silicon oxide layer is disposed along a sidewall of the first die, a portion of the upper surface, and a sidewall of the second die.

18. The bonded structure of claim 14, wherein the interconnect structure comprises a first conductive line connected to the first conductive pad by way of a first conductive via, and a second conductive line connected to the second conductive pad by way of a second conductive via.

19. The bonded structure of claim 14, wherein the second bonding surface comprises a second conductive bond pad and a second non-conductive material, the second conductive bond pad bonded to the second conductive pad, and the second non-conductive material bonded to a second portion of the non-conductive region different from the first portion.

\* \* \* \* \*